(12) United States Patent
Yanase et al.

(10) Patent No.: US 8,814,029 B2
(45) Date of Patent: Aug. 26, 2014

(54) METAL BONDING METHOD AND METAL BONDED STRUCTURE

(71) Applicant: SANYO Electric Co., Ltd., Moriguchi (JP)

(72) Inventors: Yasuyuki Yanase, Hashima (JP); Koichi Saito, Ogaki (JP); Yasuhiro Kohara, Takatsuki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 13/771,031

(22) Filed: Feb. 19, 2013

(65) Prior Publication Data

US 2013/0216302 A1      Aug. 22, 2013

Related U.S. Application Data

(63) Continuation of application No. PCT/JP2012/004775, filed on Jul. 26, 2012.

(30) Foreign Application Priority Data

Aug. 11, 2011   (JP) ................................. 2011-176387

(51) Int. Cl.
*B23K 31/02*      (2006.01)

(52) U.S. Cl.
USPC ................... 228/206; 228/248.1; 228/262.61

(58) Field of Classification Search
None
See application file for complete search history.

(56) References Cited

U.S. PATENT DOCUMENTS

| 4,888,216 | A | * | 12/1989 | Sannohe et al. | 427/216 |
| 5,068,150 | A | * | 11/1991 | Nakamura et al. | 428/407 |
| 5,439,164 | A |   | 8/1995  | Hasegawa et al. | |
| 5,551,626 | A |   | 9/1996  | Hasegawa et al. | |
| 5,812,925 | A | * | 9/1998  | Ecer | 428/548 |
| 2006/0076387 | A1 |   | 4/2006 | Ogure et al. | |
| 2008/0148904 | A1 | * | 6/2008 | Tomonari et al. | 75/247 |

(Continued)

FOREIGN PATENT DOCUMENTS

| EP | 576872 A1 |   | 1/1994 |
| JP | 56-154296 A | * | 11/1981 |

(Continued)

OTHER PUBLICATIONS

International Search Report issued in International Application No. PCT/JP2012/004775 dated Oct. 23, 2012.

(Continued)

*Primary Examiner* — Kiley Stoner
(74) *Attorney, Agent, or Firm* — McDermott Will & Emery LLP

(57) ABSTRACT

The gap between first and second bonding portions is filled with a disperse solution obtained by dispersing copper microparticles into a solution for copper oxide elution, so as to elute copper oxide configured as the outermost layer of the first bonding portion and copper oxide configured as the outermost layer of the second bonding portion, and copper oxide formed on the surface of each copper micro-particle. Pressure is applied to the first and second bonding portions using a press machine so as to raise the pressure of the disperse solution. At the same time, heat is applied under a relatively low temperature condition of 200° C. to 300° C., so as to remove the components contained in the disperse solution except for copper, thereby depositing copper. Thus, a first base portion and a second base portion are bonded via a copper bonded portion containing copper derived from the copper micro-particles.

19 Claims, 3 Drawing Sheets

(56) References Cited

U.S. PATENT DOCUMENTS

| | | | |
|---|---|---|---|
| 2010/0270365 A1* | 10/2010 | Kukimoto et al. | 228/248.1 |
| 2011/0151268 A1* | 6/2011 | Schmitt et al. | 428/457 |
| 2012/0125659 A1* | 5/2012 | Nakako et al. | 174/126.1 |
| 2012/0156512 A1* | 6/2012 | Nakano et al. | 428/457 |
| 2012/0160903 A1* | 6/2012 | Saitou et al. | 228/206 |
| 2013/0206821 A1* | 8/2013 | Saito et al. | 228/208 |
| 2013/0230740 A1* | 9/2013 | Yanase et al. | 428/675 |
| 2013/0233618 A1* | 9/2013 | Nakano et al. | 174/94 R |
| 2013/0248775 A1* | 9/2013 | Kurihara | 252/512 |

FOREIGN PATENT DOCUMENTS

| | | |
|---|---|---|
| JP | 6-015462 A | 1/1994 |
| JP | 6-262375 A | 9/1994 |
| JP | 2001-225180 A | 8/2001 |
| JP | 2003-100811 A | 4/2003 |
| JP | 2004-273230 A | 9/2004 |
| JP | 2006-334652 A | 12/2006 |
| JP | 2007-019360 A | 1/2007 |
| JP | 2008-177378 A | 7/2008 |
| JP | 2010-133015 A * | 6/2010 |
| JP | 2010-277754 A | 12/2010 |
| WO | 2004110925 A1 | 12/2004 |
| WO | 2011/152423 A1 | 12/2011 |

OTHER PUBLICATIONS

United States Office Action issued in U.S. Appl. No. 13/392,835 dated Oct. 9, 2013.

Official Translation of JP 2006-334652, originally published Dec. 14, 2006; obtained Oct. 1, 2013.

* cited by examiner

US 8,814,029 B2

METAL BONDING METHOD AND METAL BONDED STRUCTURE

BACKGROUND OF THE INVENTION

1. Field of the Invention

The present invention relates to a metal bonding method and a metal bonded structure.

2. Description of the Related Art

As an electrically conductive material used to form a wiring layer that is a component of a wiring substrate, or used to form an electrode surface of each electrode of a semiconductor chip or the like, copper is widely employed. As a conventional metal bonding method for electrically connecting a first bonding member to be bonded such as a wiring layer of a wiring substrate or the like to a second bonding member to be bonded such as an element electrode of a semiconductor chip, examples of such a conventional metal bonding methods include: a method in which the bonding faces are solder-bonded via solder; a method in which the bonding faces are bonded to each other by applying pressure while heating the bonding faces at a high temperature; and a method in which the bonding faces are activated by means of ion irradiation or the like in a vacuum so as to bond the bonding faces to each other; and so forth.

RELATED ART DOCUMENTS

Patent Documents

[Patent Document 1]
Japanese Patent Application Laid Open No. 2003-100811
[Patent Document 2]
International Patent Application WO 2004/110925
[Patent Document 3]
Japanese Patent Application Laid Open No. 2006-334652
[Patent Document 4]
Japanese Patent Application Laid Open No. 2001-225180

With such a method in which a copper member is bonded to another copper member via solder, a Cu—Sn alloy layer occurs at a bonded interface between each copper layer and the adjacent solder layer. Such a Cu—Sn alloy layer has relatively large electric resistance, and poor ductility, leading to a problem of poor electrical characteristics and/or a problem of poor connection reliability at such a bonded portion. With such a method in which the bonding faces are bonded to each other by applying pressure while heating the bonding faces at a high temperature, in some cases, such an arrangement leads to a problem of damage of the wiring substrate or the semiconductor chip due to the application of heat or the application of pressure. With such a method in which the bonding faces are activated in a vacuum so as to bond the bonding faces to each other, such an arrangement requires large-scale equipment such as a vacuum apparatus, leading to an unavoidable increase in costs.

SUMMARY OF THE INVENTION

An embodiment of the present invention relates to a metal bonding method. The metal bonding method comprises: preparing a disperse solution obtained by dispersing copper micro-particles into a solution for oxide elution into which an oxide with copper oxide as a principal component can be eluted; filling a gap between a first bonding portion formed of a first metal material and a second bonding portion formed of a second metal material with the disperse solution; further reducing a distance between the first bonding portion and the second bonding portion in a state in which the gap between them is filled with the disperse solution; and applying energy to the gap between the first bonding portion and the second bonding portion in the state in which the gap between the first bonding portion and the second bonding portion is reduced, so as to bond the first bonding portion and the second bonding portion.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 3B is an enlarged view of a relevant part (region enclosed by the rectangle in FIG. 3A) of the bonded region shown in FIG. 3A.

DETAILED DESCRIPTION OF THE INVENTION

The invention will now be described by reference to the preferred embodiments. This does not intend to limit the scope of the present invention, but to exemplify the invention.

Description will be made below regarding an embodiment of the present invention with reference to the drawings. It should be noted that, in all the drawings, the same components are denoted by the same reference symbols, and redundant description will be omitted as appropriate.

FIGS. 1 and 2 are process diagrams each showing a metal bonding method according to an embodiment. Description will be made regarding the metal bonding method according to the embodiment with reference to drawings.

Figure 1A:
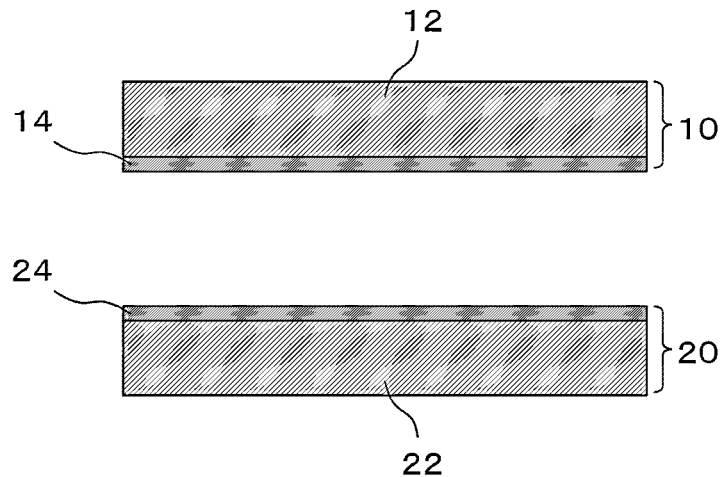
FIGS. 1A, 1B and 1C are process diagrams showing a metal bonding method according to an embodiment.

First, as shown in FIG. 1A, a first bonding portion 10 and a second bonding portion 20 are prepared. The first bonding portion 10 includes a first base portion 12 formed of a metal with copper as a principal component, and a first coating portion 14 configured to coat the surface of the bonding face side of the first base portion 12. Furthermore, the second bonding portion 20 includes a second base member 22 formed of a metal with copper as a principal component, and a second coating portion 24 configured to coat the surface of the bonding face side of the second base portion 22. The first coating portion 14 and the second coating portion 24 are each formed of an oxide material with copper oxide as a principal component. Here, "with copper as a principal component" and "with copper oxide as a principal component" mean that the material contains copper or copper oxide with a concentration that is greater than 50%.

Provided that the first base portion 12 and the second base portion 22 are formed of copper-based metal, the forms of the first base portion 12 and the second base portion 22 are not restricted in particular. For example, the first base portion 12 and the second base portion 22 may each be configured as a deposited layer formed of copper on a substrate such as a silicon substrate using a sputtering method or the like. Also, the first base portion 12 and the second base portion 22 may each be configured as an external terminal portion of a wiring layer formed by patterning a copper sheet such as a copper foil. Specifically, the first coating portion 14 and the second coating portion 24 are each configured as a thin film formed of $Cu_2O$, and each having a thickness of 10 nm, for example.

The first coating portion 14 and the second coating portion 24 may each be configured as an artificial coating film or a natural coating film. With the present embodiment, the first coating portion 14 and the second coating portion 24 are each configured as a natural oxide film, which is formed by oxidation of copper in the atmosphere.

Figure 1B:
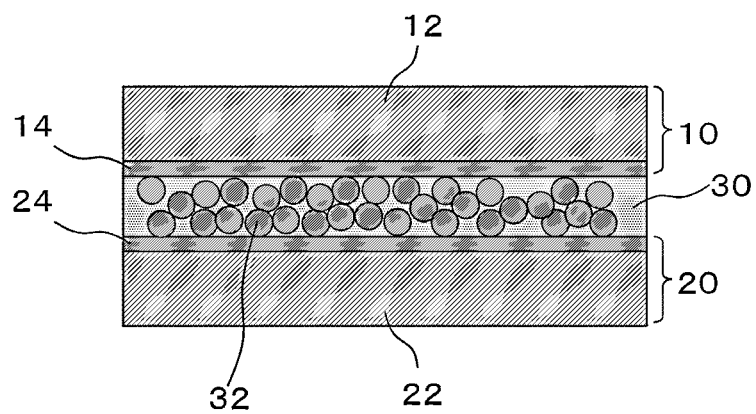

Next, as shown in FIG. 1B, the gap between the first coating portion 14 and the second coating portion 24 is filled with a disperse solution 30 obtained by dispersing copper microparticles 32 into a solution for oxide elution into which an oxide with copper oxide as a principal component can be eluted.

Specifically, after the disperse solution 30 is dropped onto or applied to the surface of the second coating portion 24 of the second bonding portion 20, the first bonding portion 10 is mounted on top of the second bonding portion 20 onto which the disperse solution 30 was dropped or to which it was applied, such that the first coating portion 14 side of the first bonding portion 10 faces the second coating portion 24 of the second bonding portion 20. Thus, the gap between the first bonding portion 10 and the second bonding portion 20 is filled with the disperse solution 30.

With the present embodiment, as a solution into which the oxide with copper oxide as a principal component can be eluted, ammonia water is prepared. The concentration of the ammonia water is 0.2% to 10%, for example. Next, 1 g of copper micro-particles is added to the ammonia water such that the copper micro-particles are dispersed into the ammonia water. The copper micro-particles have an average grain size of 5 μm, for example. Examples of a method for dispersing such copper micro-particles into ammonia water include an ultrasonic dispersion method, a stirring method, and so forth. It should be noted that the surface of each copper micro-particle is coated by a natural oxide film, i.e., a copper oxide film.

Figure 1C:
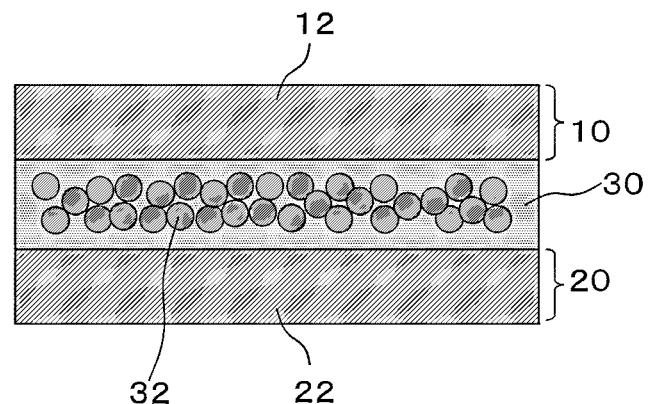

After the first coating portion 14 and the second coating portion 24 are left for a period of time on the order of 1 minute at room temperature, as shown in FIG. 1C, the copper oxide, which forms the first coating portion 14, is eluted into the solution 30, thereby removing the first coating portion 14. In the same way, the copper oxide, which forms the second coating portion 24, is eluted into the solution 30, thereby removing the second coating portion 24. By eluting the copper oxide that forms the first coating portion 14 and the copper oxide that forms the second coating portion 24 into the disperse solution 30, copper that forms a base portion 12 and copper that forms a base portion 22 are respectively exposed as the outermost face (bonding face side exposed face) of the first bonding portion 10 and the outermost face (bonding face side exposed face) of the second bonding portion 20. Furthermore, the copper oxide formed on the surface of each copper micro-particle is eluted into the disperse solution 30, whereby copper is exposed on the outermost face of each copper micro-particle 32. In the disperse solution 30, an ammonia ion that functions as a ligand and a copper ion form a copper complex. With the present embodiment, such a copper complex is considered to be configured as a thermo-degradable tetraamine copper complex ion represented by $[Cu(NH_3)_4]^{2+}$. It should be noted that ammonia water is inactive with respect to copper. Thus, copper which is a component of the first base portion 12, copper which is a component of the second base portion 22, and copper which is a component of the core of each copper microparticle 32, do not react with the ammonia water and remains as a component of the respective portions.

Figure 2A:
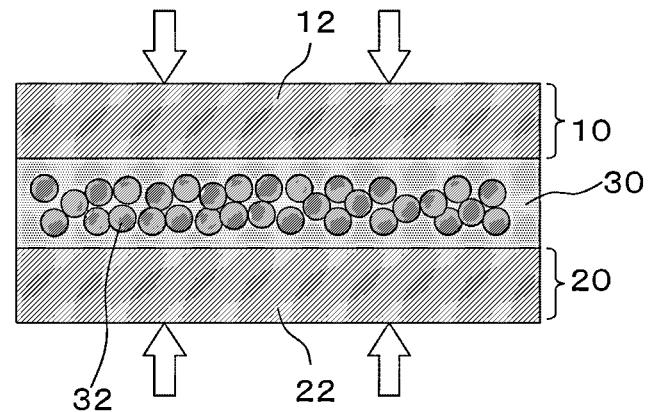
FIGS. 2A, 2B and 2C are process diagrams showing a metal bonding method according to an embodiment.

Next, as shown in FIG. 2A, pressure is applied to the first bonding portion 10 and the second bonding portion 20 by means of a press machine so as to further reduce the distance between the first bonding portion 10 and the second bonding portion 20 from the state shown in FIG. 1C. In the pressing, a pressure of 1 MPa is applied, for example.

Figure 2B:
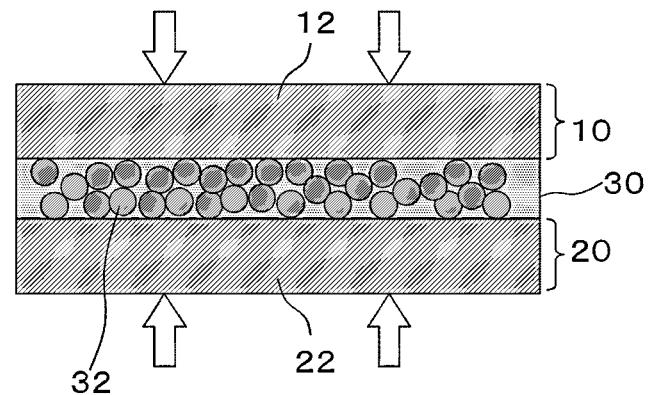

Next, as shown in FIG. 2B, heating is performed at a relatively low temperature of 200° C. to 300° C. in a state in which pressure is applied to the first bond portion 10 and the second bond portion 20, so as to remove the components contained in the disperse solution 30 except for copper, thereby depositing or otherwise recrystallizing copper. With the present embodiment, the heating provides evaporation of water. Furthermore, the heating provides thermal decomposition of the tetraamine copper complex ion, thereby providing evaporation of the ammonia component. This encourages solid-phase diffusion, and gradually increases the concentration of copper contained in the solution 30. Furthermore, pressing by means of the press machine gradually reduces the distance between the outermost face of the first bonding portion 10 and the outermost face of the second bonding portion 20. With the present embodiment, the energy required to bond the first bonding portion 10 and the second bonding portion 20 is applied in the form of heating. The method for applying the energy to the gap between the first bonding portion 10 and the second bonding portion 20 is not restricted to heating. Also, a method in which ultrasonic vibration energy is supplied by means of an ultrasonic vibration apparatus may be applied, for example.

Figure 2C:
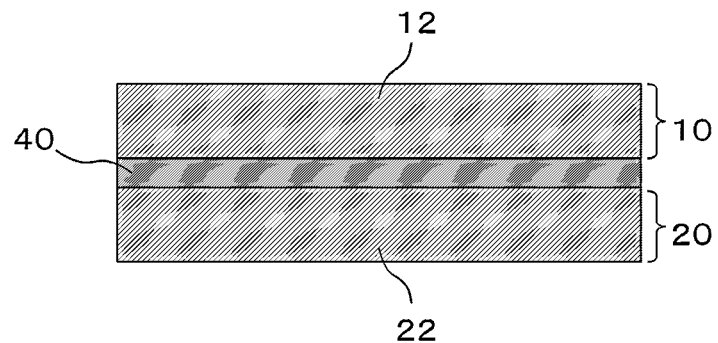

Next, as shown in FIG. 2C, after the completion of removal of components contained in the disperse solution 30 except for the copper component, the outermost face of the first bonding portion 10 and the outermost face of the second bonding portion 20 are bonded to each other via a copper bonded portion 40 formed of the copper derived from the copper oxide and the copper derived from the copper microparticles 32 shown in FIG. 2B. The copper bonded portion 40 exhibits high orientation and high stability. Furthermore, the copper bonded portion 40 contains copper derived from the copper micro-particles. Thus, the copper bonded portion 40 has a copper grain size that is smaller than the copper grain size of the first bonding portion 10 and the copper grain size of the second bonding portion 20. The thickness of the copper bonded portion 40 in the final stage is adjusted according to the quantity of copper micro-particles contained in the disperse solution. For example, the copper bonded portion 40 is configured to have a thickness of 1 to 10 μm. After the completion of bonding via the copper bonded portion 40, the heating is stopped, and the copper bonded portion 40 is cooled until its temperature reaches on the order of room temperature. It should be noted that the period of time from the start of heating up to the stop of heating is 10 minutes, for example. After the cooling, the pressure application is stopped, whereby the bonding step for the first bonding portion 10 and the second bonding portion 20 is completed.

With the metal bonding method described above, such an arrangement is capable of bonding a pair of copper members at a relatively low temperature without involving large-scale equipment such as a vacuum apparatus or the like. Specifically, by elution of the first coating portion 14 and the second coating portion 24 into the disperse solution 30, copper is exposed on the bonding face of the first bonding portion 10 and the bonding face of the second bonding portion 20. In other words, the bonding face of the first bonding portion 10 and the bonding face of the second bonding portion 20 are activated. After the bonding face of the first bonding portion 10 and the bonding face of the second bonding portion 20 are activated, the first bonding portion 10 and the second bonding portion 20 are bonded to each other via the copper bonded portion 40 containing copper derived from the copper microparticles 32. The copper bonded portion 40 has a thickness that corresponds to the copper derived from the copper micro-particles 32. Thus, even if voids occur between the bonding face of the first bonding portion 10 and the copper bonded portion 40 or between the bonding face of the second bonding portion 20 and the copper bonded portion 40, such an arrangement prevents such voids from occurring in the form of a line. Thus, such an arrangement provides improved reliability of the connection between the first bonding portion 10 and the second bonding portion 20.

The thickness of the copper bonded portion 40 can be adjusted by adjusting the copper derived from the copper micro-particles. Thus, such an arrangement allows the bonding distance between the first bonding portion 10 and the second bonding portion 20 to be adjusted as necessary in a simple manner.

Even if the bonding face of the first bonding portion 10 or the bonding face of the second bond portion 20 has irregularity on the order of the diameter of each copper micro-particle 32 or otherwise several times the diameter of each copper micro-particle 32, these recesses are filled by the copper micro-particles 32. Thus, such an arrangement allows the first bonding portion 10 and the second bonding portion 20 to be bonded to each other without polishing the bonding faces.

[Solution Used for Metal Bonding]

With the metal bonding method according to the aforementioned embodiment, ammonia water is used as a solution to be used for metal bonding. However, the present invention is not restricted to such an arrangement. Rather, a desired solution may be employed provided that the solution contains a ligand that can form a complex with copper. Examples of such a solution include a carboxylic acid aqueous solution.

Examples of carboxylic acids used to prepare such a carboxylic acid aqueous solution include: monocarboxylic acid such as acetic acid, and the like; dicarboxylic acid such as oxalic acid, malonic acid, succinic acid, glutaric acid, phthalic acid, maleic acid, and the like; and oxycarboxylic acid such as tartaric acid, citric acid, lactic acid, salicylic acid, and the like.

With such an arrangement, such a carboxylic acid aqueous solution preferably contains carboxylic acid which is able to function as a multidentate ligand. With such a carboxylic acid aqueous solution containing carboxylic acid which is able to function as a multidentate ligand, the carboxylic acid and copper form a chelate, thereby generating a copper complex having markedly improved stability. As a result, such an arrangement is capable of reducing the temperature required for the bonding. It should be noted that the fact that tartaric acid forms a chelate is described in "The Iwanami Dictionary of Physics and Chemistry", 4th ed., p. 593 (Iwanami Shoten). Also, the fact that tartaric acid, oxalic acid, or the like, forms a chelate is described in "Inorganic chemistry", Vol. 2, p. 666, written by R. B. Heslop, K. Jones, translated by Yoshihiko Saito. Here, chelation represents a reaction in which a multidentate ligand forms a ring, thereby generating a complex having markedly improved stability.

More specifically, in a case in which citric acid is employed as the solution to be used for metal bonding, in the step shown in FIG. 1B, a disperse solution is employed that has been obtained by adding 1 g of copper micro-particles having an average grain size of 5 µm to 20 mL of a citric acid solution (concentration of 10%).

It should be noted that, if such a solution that is used to elute an oxide with copper oxide as a principal component can also be used to elute an oxide of a metal that differs from copper, e.g., aluminum oxide, either one of the first bonding portion 10 or the second bonding portion 20 may be formed of aluminum-based metal. Specifically, citric acid can be used to elute aluminum oxide. Thus, by employing citric acid as a solution for elution of an oxide with copper oxide as a principal component, such an arrangement enables aluminum-aluminum bonding and aluminum-copper bonding. In this case, the bonding portions are respectively formed of copper and aluminum.

EXAMPLE

Figures 3A, 3B:
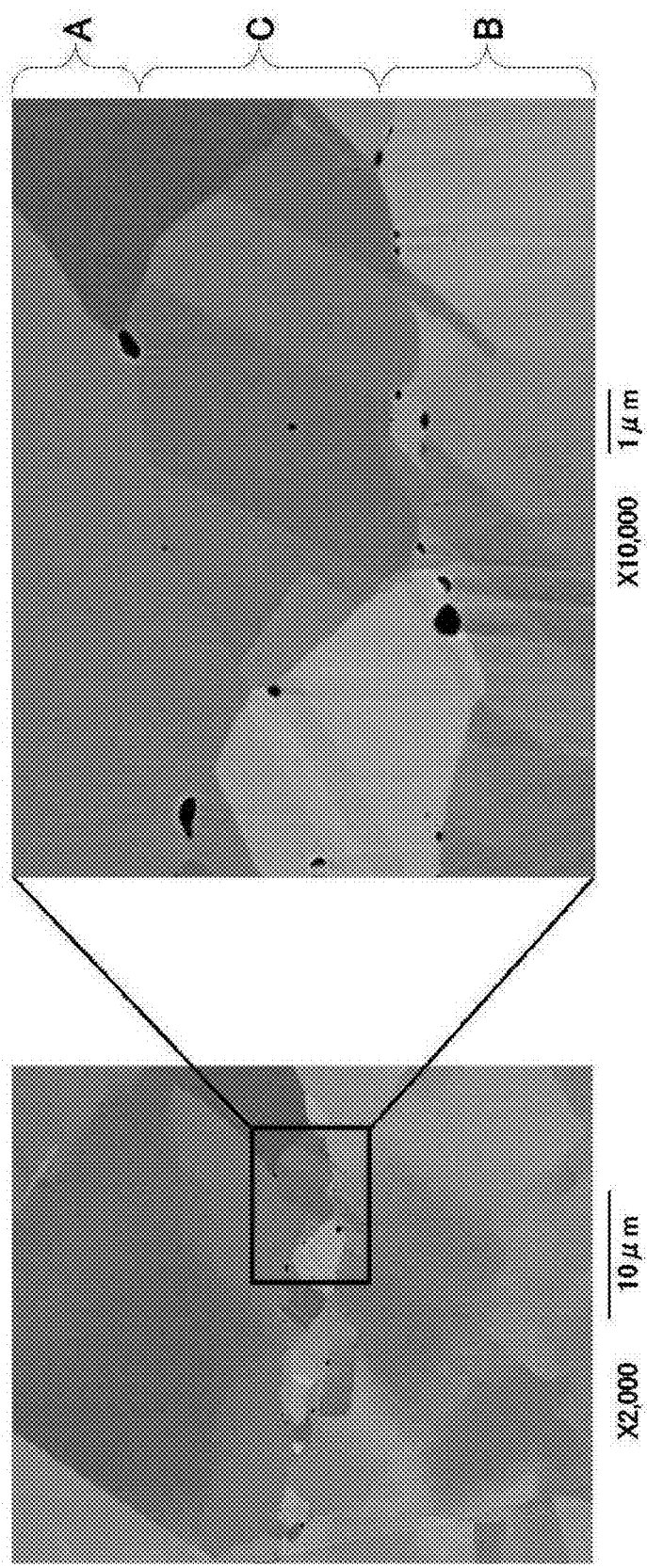
FIGS. 3A and 3B show cross-sectional SEM images obtained by observing the bonded face of an obtained metal bonded structure.

A disperse solution is prepared by dispersing 1 g of copper micro-particles having an average grain size of 5 µm into 20 mL of citric acid solution (concentration of 10%), so as to perform copper-copper bonding using the aforementioned metal bonding method. FIGS. 3A and 3B show cross-sectional SEM images obtained by observing the bonded face of a metal bonded structure thus obtained. FIG. 3B is an enlarged view of a relevant part (region enclosed by the rectangle in FIG. 3A) of the bonded region shown in FIG. 3A. The region A and the region B respectively correspond to the bonding portions formed of copper. The region C corresponds to a bonded region containing copper derived from the copper micro-particles, which also corresponds to the copper bonded portion 40 shown in FIG. 2C. The region C has a thickness of approximately 3 µm. It has been confirmed that the region C has copper grains having a size that is smaller than the copper grain size in the region A and the copper grain size in the region B. Furthermore, it has been confirmed that the region C having thickness along the layered direction has randomly scattered voids between the adjacent copper grains, and that such voids do not occur in the form of a line. It should be noted that the region C that functions as the copper bonded portion 40 is defined by the uneven shape of the copper bonding face that functions as the first bonding portion 10 or the uneven shape of the copper bonding face that functions as the second bonding portion 20. Thus, the region C is not necessarily configured as a linear band region. In some cases, the region C is configured in a wavy shape.

The present invention is not restricted to the aforementioned embodiment. Also, various kinds of modifications such as design modifications may be made based on the knowledge of those skilled in this art, which are also encompassed within the technical scope of the present invention.

It should be noted that the invention according to the present embodiment may be specified according to the items described below.

[Item 1] A metal bonding method comprising:

preparing a disperse solution obtained by dispersing copper micro-particles into a solution for oxide elution into which an oxide with copper oxide as a principal component can be eluted;

filling a gap between a first bonding portion formed of a first metal material and a second bonding portion formed of a second metal material with the disperse solution;

further reducing a distance between the first bonding portion and the second bonding portion in a state in which the gap between them is filled with the disperse solution; and applying energy to the gap between the first bonding portion and the second bonding portion in the state in which the gap between the first bonding portion and the second bonding portion is reduced, so as to bond the first bonding portion and the second bonding portion using the copper micro-particles.

[Item 2] A metal bonding method according to Item 1, wherein, in the preparation of the disperse solution, micro-particles each having a structure in which a core formed of copper is coated by copper oxide are dispersed into the oxide-eluting solution, thereby eluting the copper oxide that coats each core.

[Item 3] A metal bonding method according to Item 1 or 2, further comprising cooling the bonded portion after the first bonding portion and the second bonding portion are bonded to each other.

[Item 4] A metal bonding method according to any one of Items 1 through 3, wherein the oxide-eluting solution is inactive with respect to copper.

[Item 5] A metal bonding method according to any one of Items 1 through 4, wherein the oxide-eluting solution contains a ligand that can form a complex with copper.

[Item 6] A metal bonding method according to Item 5, wherein the complex is thermally degradable.

[Item 7] A metal bonding method according to any one of Items 1 through 6, wherein the solution is configured as ammonia water, or otherwise as a carboxylic acid aqueous solution.

[Item 8] A metal bonding method according to Item 7, wherein carboxylic acid contained in the aforementioned carboxylic acid aqueous solution functions as a multidentate ligand.

[Item 9] A metal bonding method according to Item 8, wherein the multidentate ligand forms at least two coordinate bonds with a single copper ion.

[Item 10] A metal bonded structure comprising:
  a first bonding portion formed of a first metal material;
  a second bonding portion formed of a second metal material; and
  a bonded portion formed as a region between the first bonding portion and the second bonding portion, and having a plurality of voids in a scattered manner.

[Item 11] A metal bonded structure according to Item 10, wherein the bonded portion is formed of copper or otherwise an alloy formed of copper and the first metal material or the second metal material.

What is claimed is:

1. A metal bonding method for bonding a first metal having a first oxide layer and a second metal having a second oxide layer, the first and second oxide layers each including a copper oxide as a principal component, the method comprising:
  filling a gap between the first oxide layer of the first metal and the second oxide layer of the second metal with a solution including copper micro-particles, oxide including the copper oxide eluting into the solution from the first and second oxide layers;
  pressing the first metal and the second metal against each other to reduce the gap after the gap is filled with the solution; and
  applying heat to the gap with the first metal and the second metal pressed against each other, wherein
  grains derived from the copper micro-particles remain in the gap between the first metal and the second metal during the heat applying step, and
  the first metal and the second metal are bonded only with copper derived from at least the copper micro-particles.

2. The metal bonding method according to claim 1, further comprising preparing the solution, wherein
  the copper micro-particles each having a structure in which a core formed of copper is coated by copper oxide are dispersed into the solution, thereby eluting the copper oxide that coats each core.

3. The metal bonding method according to claim 1, further comprising cooling a bonded portion after the first metal and the second metal are bonded to each other.

4. The metal bonding method according to claim 2, further comprising cooling a bonded portion after the first metal and the second metal are bonded to each other.

5. The metal bonding method according to claim 1, wherein the oxide-eluted solution is inactive with respect to copper.

6. The metal bonding method according to claim 2, wherein the oxide-eluted solution is inactive with respect to copper.

7. The metal bonding method according to claim 3, wherein the oxide-eluted solution is inactive with respect to copper.

8. The metal bonding method according to claim 1, wherein the oxide-eluted solution contains a ligand that forms a complex with copper.

9. The metal bonding method according to claim 2, wherein the oxide-eluted solution contains a ligand that forms a complex with copper.

10. The metal bonding method according to claim 8, wherein the complex is thermally degradable.

11. The metal bonding method according to claim 9, wherein the complex is thermally degradable.

12. The metal bonding method according to claim 1, wherein the solution is configured as ammonia water, or otherwise as a carboxylic acid aqueous solution.

13. The metal bonding method according to claim 2, wherein the solution is configured as ammonia water, or otherwise as a carboxylic acid aqueous solution.

14. The metal bonding method according to claim 12, wherein carboxylic acid contained in the carboxylic acid aqueous solution functions as a multidentate ligand.

15. The metal bonding method according to claim 13, wherein carboxylic acid contained in the carboxylic acid aqueous solution functions as a multidentate ligand.

16. The metal bonding method according to claim 14, wherein the multidentate ligand forms at least two coordinate bonds with a single copper ion.

17. The metal bonding method according to claim 15, wherein the multidentate ligand forms at least two coordinate bonds with a single copper ion.

18. The metal bonding method according to claim 1, wherein the grains between the first metal and the second metal remain after the heat applying step.

19. The metal bonding method according to claim 18, wherein a size of the grains between the first metal and the second metal is smaller than that of copper grains of the first metal and the second metal.

* * * * *